(12) United States Patent
Yandoc et al.

(10) Patent No.: US 10,714,413 B2
(45) Date of Patent: Jul. 14, 2020

(54) LEADFRAME ASSEMBLY FOR A SEMICONDUCTOR DEVICE

(71) Applicant: NEXPERIA B.V., Nijmegen (NL)

(72) Inventors: Ricardo Lagmay Yandoc, Nijmegen (NL); Adam Richard Brown, Nijmegen (NL); Reinald John Salazar Roscain, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/715,385

(22) Filed: Dec. 16, 2019

(65) Prior Publication Data

US 2020/0194354 A1     Jun. 18, 2020

(30) Foreign Application Priority Data

Dec. 17, 2018 (EP) .................................... 18212898

(51) Int. Cl.
*H01L 23/495* (2006.01)
*H01L 23/00* (2006.01)

(52) U.S. Cl.
CPC .. *H01L 23/49562* (2013.01); *H01L 23/49503* (2013.01); *H01L 23/49537* (2013.01); *H01L 24/37* (2013.01); *H01L 24/40* (2013.01); *H01L 2224/37012* (2013.01); *H01L 2224/40245* (2013.01); *H01L 2924/13091* (2013.01)

(58) Field of Classification Search
CPC ... H01L 23/49537; H01L 24/40; H01L 24/37; H01L 23/49503

USPC ....................................................... 174/126.1
See application file for complete search history.

(56) References Cited

U.S. PATENT DOCUMENTS

| 4,994,412 A | 2/1991 | Kalfus et al. |
|---|---|---|
| 5,110,761 A | 5/1992 | Kalfus et al. |
| 2009/0218673 A1 | 9/2009 | Sun et al. |
| 2011/0068442 A1* | 3/2011 | Satoh ................ H01L 23/49541 257/666 |

FOREIGN PATENT DOCUMENTS

| EP | 2930747 A1 | 10/2015 |
|---|---|---|
| EP | 3336881 A1 | 6/2018 |

OTHER PUBLICATIONS

European Search Report for corresponding application EP18212898.3, dated Jul. 2, 2019, 8 pages.

* cited by examiner

*Primary Examiner* — Sherman Ng
(74) *Attorney, Agent, or Firm* — Ohlandt, Greeley, Ruggiero & Perle, LLP

(57) ABSTRACT

The present disclosure relates to a lead frame assembly for a semiconductor device. The leadframe assembly includes a clip frame structure with a die connection portion configured and arranged for contacting to one or more contact terminals on a top side of a semiconductor die; and one or more electrical leads extending from the die connection portion at a first end. The die connection portion includes a hooking tab extending therefrom configured and arranged to engage with a wire loop of a wire pull test equipment. The disclosure also relates to an interconnected matrix of such leadframe.

16 Claims, 6 Drawing Sheets

LEADFRAME ASSEMBLY FOR A SEMICONDUCTOR DEVICE

CROSS REFERENCE TO RELATED APPLICATIONS

This application claims the benefit under 35 U.S.C. § 119(a) of European Application No. 18212898.3 filed Dec. 17, 2018 the contents of which are incorporated by reference herein in their entirety.

BACKGROUND OF THE DISCLOSURE

1. Field of the Disclosure

The present disclosure relates to a leadframe assembly for a semiconductor device. In particular the present disclosure relates a clip leadframe assembly for a semiconductor device and a matrix of such leadframe assemblies.

2. Description of the Related Art

For discrete semiconductor devices such as MOSFETs, it is possible to determine the reliability of source electrical connections to a semiconductor die metallisation using a DC test such as electrical drain source resistance measurements known as RDS testing. However, due to the presence of the insulating gate oxide it is not possible to use DC measurements to test the gate connections. Also, more generally, there are problems associated with RDS testing whereby an RDS test shows good electrical results but the mechanical bond is not well formed. For example, in the case of clip bonded electrical connections, the metal clip may be in contact with the die metallisation terminal and show good RDS characteristics, however the solder connection to the metallisation may be poor and thus potentially fail in cases where the connections undergo thermal expansion during reflow processes or during device operation. In such cases the connection may fail despite passing an RDS test.

In semiconductor manufacturing a so-called bond shear testing is used to evaluate the quality of a wire bond connection from a device terminal to a contact on the semiconductor die. Such tests are used as quality tests to verify bond consistency and determine reliability of the bonds. According to recognised standards the aim of the test is to measure bond strengths, evaluate bond strength distributions, and/or determine compliance with specified bond strength requirements. The test may be destructive or non-destructive. In the case of destructive testing the wire is pulled until either the wire or the bond connection fails. In the case of non-destructive testing the bond is tested to determine the pulling force it can resist. Typically, prior to encapsulation of the semiconductor device a mechanical test hook is looped under the wire and the hook is then pulled with a certain force. The test may be carried out using a wire bond test machine or may be carried out manually by technicians or operators.

In semiconductor devices, clip bonded packages are commonly used to make connections from a semiconductor die to external contacts of the device. Clip bonded packages have a number of advantages over conventional wire bonded packages. For example, clip bonded packages are typically used for mechanically robust and reliable electrical connections to and from the semiconductor die in automotive applications. For semiconductor devices using so-called clip packages, such as LFPAK, the above problems related to DC testing remain. Furthermore, with clip based packages it is difficult to insert the mechanical test hook under the source or gate clips due to close proximity of the clip to the semiconductor die. In addition, clip packages are typically arranged as an interconnected matrix, whereby each unit of the matrix corresponds to the clip connections for an individual semiconductor device.

During reflow processing of the semiconductor device, the clip may become tilted or misaligned with a terminal of the semiconductor die, for example due to outgassing effects. It is desirable to test the reliability of misaligned clips to determine if the connection of the clip to the terminal of the die is reliable. It is also desirable to test all or a sample of such semiconductor devices, in particular when such device are used in safety critical applications such as automotive applications.

SUMMARY

Various example embodiments are directed to issues such as those addressed above and/or others which may become apparent from the following disclosure concerning leadframe assemblies for semiconductor devices. In certain example embodiments, aspects of the present disclosure involve the use of a leadframe assemblies that provide for simple reliability testing.

According to an embodiment there is provided a leadframe assembly for a semiconductor device, the leadframe assembly comprising: a clip frame structure; the clip frame structure comprising: a die connection portion configured and arranged for contacting to one or more contact terminals on a top side of a semiconductor die; one or more electrical leads extending from the die connection portion at a first end, wherein the die connection portion comprises an hooking tab extending therefrom configured and arranged to engage with a wire loop of a wire pull test equipment.

According to an embodiment there is provided a leadframe assembly for a semiconductor device, the leadframe assembly comprising: a clip frame structure; the clip frame structure comprising: a die connection portion configured and arranged for contacting to one or more contact terminals on a top side of a semiconductor die; one or more electrical leads extending from the die connection portion at a first end, wherein the die connection portion comprises an hooking tab extending therefrom configured and arranged to be engaged with a wire loop of a wire pull test equipment.

The die connection portion may be substantially elongate and comprise a downward extending portion at a point where the die connection portion is arranged to contact a terminal of the semiconductor die.

The downward extending portion may raise the hooking tab corresponding to the height of the downward extending portion.

The hooking tab may be arranged to extend at an angle of substantially 0 degrees from the die connection portion to substantially 90 degrees from the die connection portion.

The hooking tab may be arranged such that it extends substantially orthogonally from the die connection portion.

The hooking tab may include an extension portion extending therefrom configured and arranged to engage with a wire loop of a wire pull test equipment. The hooking tab may integrally be formed with die connection portion. The extension portion may be integrally formed with the hooking tab.

The die connection portion may be a gate connection to the semiconductor die. The die connection portion may be a source connection to the semiconductor die.

The lead frame assembly according to an embodiment may further comprise a dam bar extending orthogonally across the one or more electrical leads.

There is also provided a lead frame matrix in which a unit of the matrix comprises a lead frame assembly according to embodiments. Adjoining units of the matrix are connected by respective dam bars of each lead frame assembly.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1B:
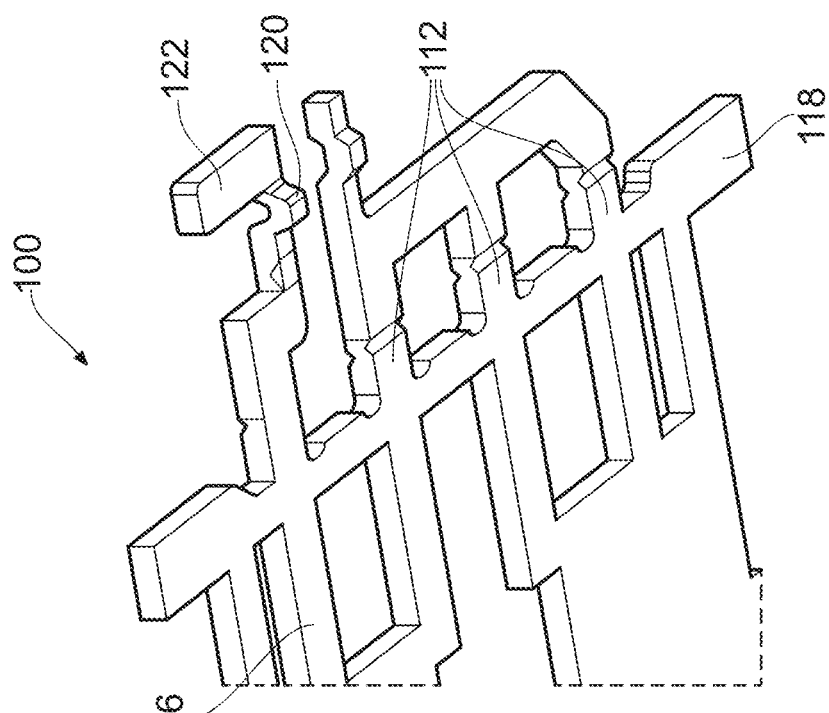
FIG. 1b is a bottom side perspective view of a leadframe assembly according to embodiments.
Figure 1A:
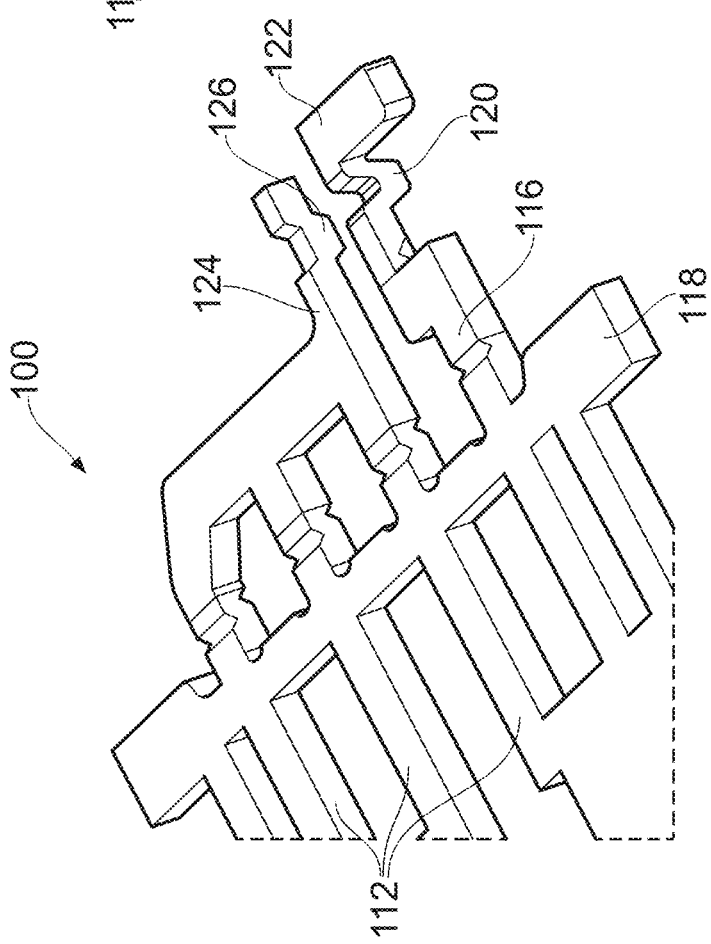
FIG. 1a is a top side perspective view of a leadframe assembly according to embodiments.

A lead frame assembly 100 according to an embodiment is illustrated in FIGS. 1a and 1b. By way of general overview, the lead frame assembly 100 may further comprise one or more sets of leads 112, 116 extending from a first side thereof. At a first end, a first set of leads 112 may be integrally connected to form a first connection point, or die connection portion, suitable for connection to a first contact terminal of a semiconductor die (not illustrated in FIGS. 1a and 1b), such a source terminal. At a second end, distal the first end, the leads 112 may be connected to each other and arranged to form a support member (not illustrated) wherein the support member may be arranged to contact and be supported by a die attach structure (not illustrated). A second lead 116 may be arranged to be connected to the support member, where the second lead 116 may be arranged to be connected to a further contact terminal of the semiconductor die, such as a gate terminal of the semiconductor die. Optionally, a dam-bar 118 may be integrally formed with the leads and may extend orthogonally across the one or more leads 112, 116.

The second lead 116 is substantially elongate and of generally of uniform thickness along its length. However, the second lead 116 includes a downwardly extending portion, or down stand 120, to facilitate connection of the second lead 116 to a metallisation terminal of the semiconductor die. The down stand 120 may be formed by locally increasing the thickness of the second lead 116 at the point where it contacts the terminal of the semiconductor die. In this way the down stand 120 has a height from the point where it will contact the semiconductor to the point where is joins the second lead 116. Alternatively, the down stand 120 may be formed by deforming the second lead 116 to include a double bend to form a U-shaped portion or V-shaped portion, at the point where it contacts the terminal of the semiconductor die.

A hooking tab 122 is arranged at the end of the second lead 116 distal the support member 114 and adjacent to the down stand 120. The hooking tab 122 is configured and arranged such that a wire loop or hook of a wire pull test equipment may be looped around or under and thus mechanically engage with the hooking tab 122. The down stand 120 facilitates ease of engagement of the wire pull test equipment with the hooking tab 122, by ensuring that the hooking tab 122 is raised above and spaced apart from a top surface of the semiconductor die.

The hooking tab 122 is arranged as an extension of the second lead 116 and may extend away from the second lead 116 in a direction substantially orthogonal to the second lead 116 as illustrated. Similarly, the hooking tab 122 may extend away from the second lead 116 along the same axis as the second lead 116. Likewise, the hooking tab 122 may extend away from the second lead 116 at any position intermediate the direction substantially orthogonal to the second lead 116 and the direction along the same axis as the second lead 116. In any case, the hooking tab 122 is arranged such that it extends in outward direction away from the second lead. In this way the hooking tab is arranged to extend at an angle of 0 degrees from the second lead 116 to substantially 90 degrees from the second lead 116. This allows for ease of access of the hooking tab and therefore ease of engagement with the wire loop of a wire pull test equipment.

Based on the present disclosure, the skilled person will appreciate that the hooking tab 122 may extend from the second lead 116 in any suitable direction. The hooking tab 122 should preferably have a length such that it does not extend outside the eventually moulded semiconductor device. In other words, the hooking tab 122 may be arranged so that it is contained within the finally packaged semiconductor device. In doing so the risk of a short circuit or leakage currents to the second lead 116 is minimised. In addition, the hooking tab 122 should preferably be arranged such that when viewed from above as in FIG. 2, it points away from the centre of the semiconductor die. In this way the risk of potential damage to the semiconductor die is minimised during the pull test procedure.

The hooking tab 122 may be unitarily formed with the second lead 116 and may have the same thickness as the second lead 116 at the point where the hooking tab 122 meets the second lead 116. Optionally, the hooking tab 122 may include a notch (not illustrated) formed on an its underside, to facilitate gripping of the wire pull test equipment. Alternatively, a hole (not illustrated) may be provided through the hooking tab 122 to allow for insertion of the wire pull test equipment to facilitate gripping of the wire pull test equipment thereon.

The hooking tab 122 should preferably formed such that extends away from the end of the second lead 116, such that the down stand 120 is at a position intermediate the point where the second lead 116 intersects the dam-bar 118 and the hooking tab 122. In this way the pulling moment about the intersection of the second lead 116 and the dam-bar 118, acting a pivot point, is maximised.

Figure 2:
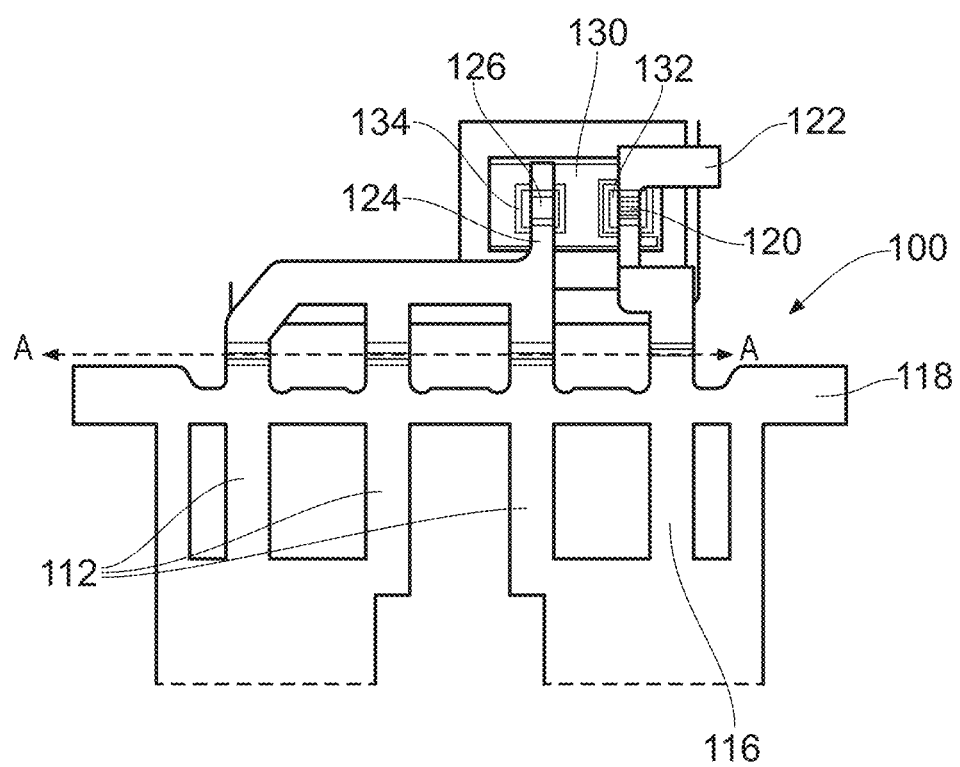
FIG. 2 is a top side view of the leadframe assembly connected to a semiconductor die.

FIG. 2, illustrates a lead frame assembly as set out above mounted on a MOSFET semiconductor die 130, where the down stands 120, 126 of first and second leads contact respective gate and source terminals 132, 134 arranged on a top surface of the semiconductor die 130. Following mounting of the lead frame assembly 100 on the semiconductor die 130, processing of the semiconductor device continues by moulding the lead frame assembly 100 and the semiconductor die 130 and then trimming the leads along line A-A to form the final semiconductor device. Prior to moulding of device, the wire pull test equipment may be connected to the hooking tab 122 for testing the bond connection of the lead to the respective gate and source terminals 132, 134 of the semiconductor die 130.

Figure 3:
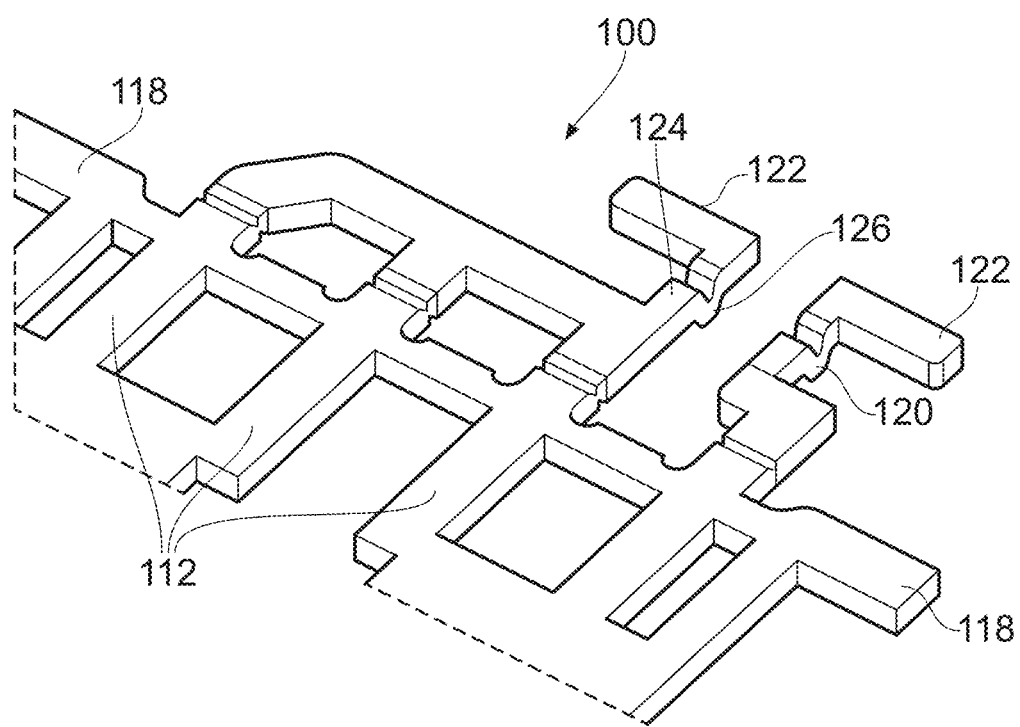
FIG. 3 is a top side perspective view of a leadframe assembly according to embodiments.
Figure 4:
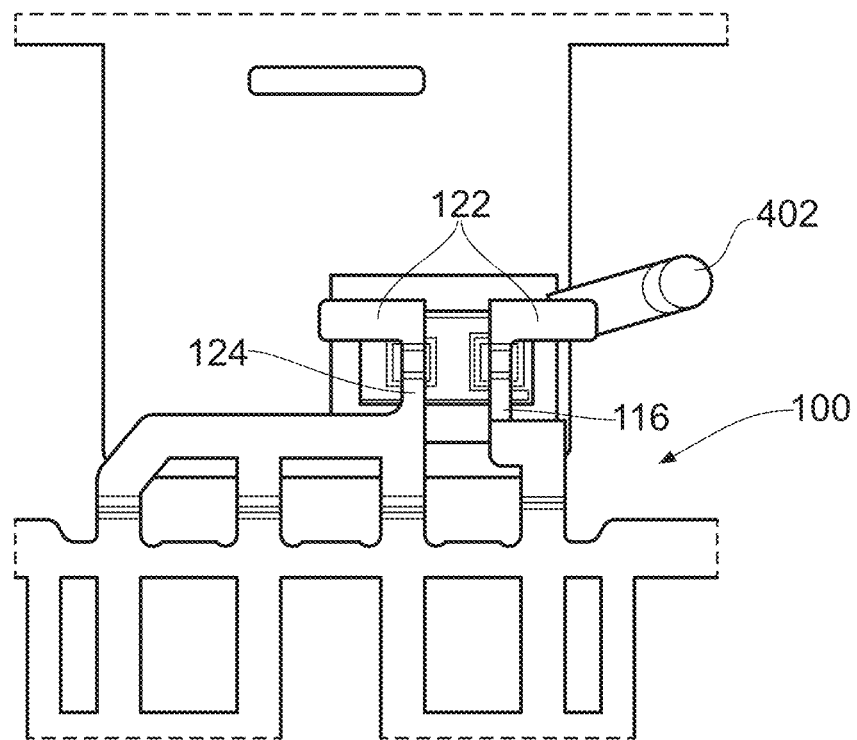
FIG. 4 is a top side view of the leadframe assembly according to embodiments connected to a semiconductor die.

Whilst FIGS. 1a, 1b and 2, illustrate a hooking tab 122 formed on the second lead 116, the gate lead in this example, the skilled person will also appreciate that a similar hooking tab 122 may also be arranged on another lead. For example, as well as the hooking tab 122 being formed on the gate lead (second lead), the hooking tab may be formed on the source lead (first lead) or both the source lead and the gate lead. As illustrated in FIG. 3, the first set of leads 112, may be formed to converge to a single lead were the single lead is configured as a source lead 124 for connection to a source terminal of the semiconductor die. The source lead 124 may also include a down stand 126, as described above, for contacting to a source terminal on a top surface of a semiconductor die. Following the principles discussed above with respect to FIGS. 1a, 1b and 2, the source lead 124 including a hooking tab 122 should preferably have a length such that it does not extend outside the eventually moulded semiconductor device. In doing so, the risk of a short circuit or leakage currents to the source lead 124 is minimised. In addition, when viewed from above as in FIG. 4, the hooking tab 122 should preferably be arranged such that it points away from the semiconductor die. In this way the risk of potential damage to the semiconductor die is minimised during the pull test procedure. FIG. 4 illustrates the arrangement of FIG. 3 connected to a semiconductor die consistent with the discussion above in relation to FIG. 2. A wire loop or hook 402 of a wire pull test equipment looped under the hooking tab 122 of the gate lead 124.

Whilst FIG. 3 and FIG. 4 show hooking tab 122 located on both the source lead and gate lead, the skilled person will appreciate that one or other of the hooking features may be omitted as required by the application of the lead frame assembly 100.

Figure 5:
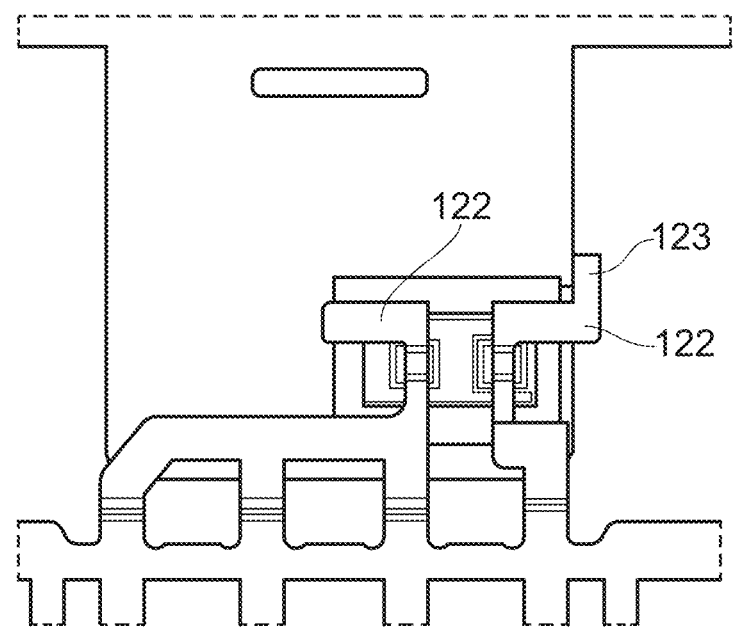
FIG. 5 is a top side view of the leadframe assembly connected to a semiconductor die.

FIG. 5 illustrates a further example according to embodiments whereby the hooking tab 122 includes an extension portion 123. By including this extension portion, the pulling moment on the hooking tab 122 may be further increased when compared to the arrangement of FIG. 2, whilst ensuring that the hooking tab 122 and extension portion 123 do not extend outside the eventually moulded semiconductor device. Based on the above discussion with respect to the relative orientation of the hooking tab with respect to the leads, the extension portion 123 should preferably be arranged such that when viewed from above as in FIG. 2, it points away from the centre of semiconductor die.

Whilst FIG. 5 illustrates the extension portion 123 arranged on the hooking tab 122 of the gate lead, following the above principles, the skilled person will appreciate that a similar extension portion could be included on the source lead.

According to embodiments, the first leads 112, 124 may form source connections to a source terminal on top side of the semiconductor die 106. The second leads 116 may form a gate connection to a gate terminal 118 also formed on the top side of the semiconductor die 106. In this regard, the semiconductor die 106 may be a field effect transistor.

Figure 6:
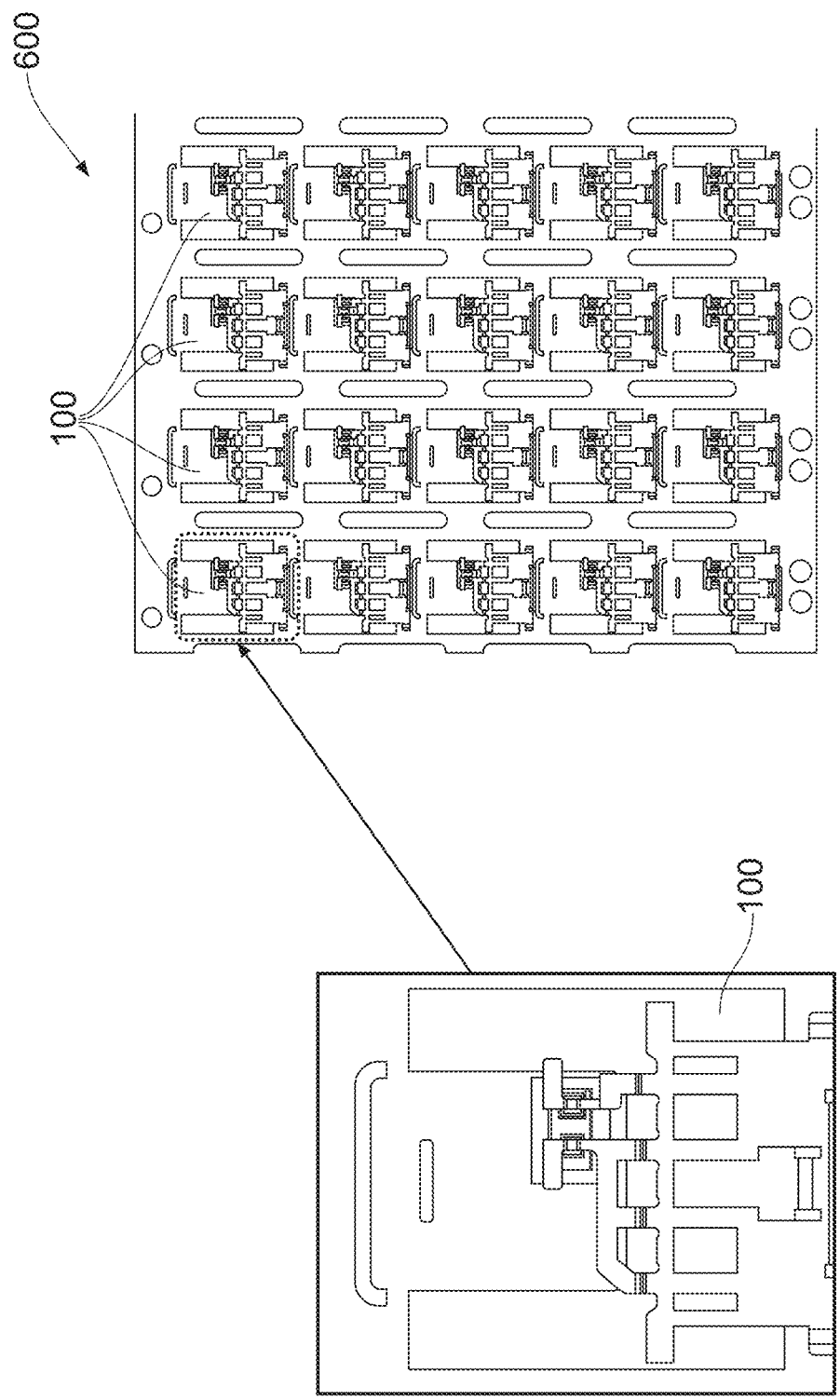
FIG. 6 is a top side view of a matrix of leadframe assemblies according to embodiments.

Turning now to FIG. 6, a matrix arrangement 600 of lead frame assemblies 100 according to embodiments as discussed above is illustrated. In the example of FIG. 6 the matrix 600 is arranged as a 4×5 matrix, however the skilled will appreciate that any number of rows or columns may be included. The inset to FIG. 6 illustrates an individual leadframe assembly 100 according to the above described arrangements and the matrix 600 illustrates the interconnected nature of matrix of individual leadframe assemblies.

In addition, whilst embodiments of the disclosure are discussed in relation to MOSFET semiconductor devices and specifically source and gate clip based leads, they are not so limited. The skilled person will appreciate that the present disclosure is also relevant to clip based leadframe assemblies of any semiconductor device and in particular discrete devices such as for example bipolar transistors. In the example of bipolar transistors, the hooking feature may be applied to one of more of a base clip, collector clip or emitter clip connections as appropriate. Where the semiconductor die is a bipolar junction transistor. The first leads 112 may form collector connections to a collector terminal 110 on the top side of a semiconductor die. The second lead 124 may form a base connection to a base terminal also formed on the top side of the semiconductor die 108.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A lead frame assembly for a semiconductor device, the leadframe assembly comprising:
   a clip frame structure;
   the clip frame structure comprising:
   a die connection portion configured and arranged for contacting to one or more contact terminals on a top side of a semiconductor die; and
   one or more electrical leads extending from the die connection portion at a first end, wherein the die connection portion comprises a hooking tab extending therefrom that is configured and arranged to be engaged with a wire loop of a wire pull test equipment,
wherein the die connection portion is substantially elongate and further comprises a downward extending portion at a point where the die connection portion is arranged to contact a terminal of the semiconductor die.

2. The lead frame assembly according to claim 1, wherein the hooking tab is arranged to extend at an angle of substantially 0 degrees from the die connection portion to substantially 90 degrees from the die connection portion.

3. The lead frame assembly according to claim 1, wherein the hooking tab is arranged so that it extends substantially orthogonally from the die connection portion.

4. The lead frame assembly according to claim 1, wherein the downward extending portion raises the hooking tab to a corresponding height of the downward extending portion.

5. The lead frame assembly according to claim 4, wherein the hooking tab is arranged to extend at an angle of substantially 0 degrees from the die connection portion to substantially 90 degrees from the die connection portion.

6. The lead frame assembly according to claim 4, wherein the hooking tab is arranged so that it extends substantially orthogonally from the die connection portion.

7. The lead frame assembly according to claim 1, wherein the hooking tab includes an extension portion extending therefrom configured and arranged to engage with the wire loop of the wire pull test equipment.

8. The lead frame assembly according to claim 1, wherein the hooking tab is integrally formed with the die connection portion.

9. The lead frame assembly according to claim 7, wherein the extension portion and is integrally formed with the hooking tab.

10. The lead frame assembly according to claim 1, wherein the die connection portion is a gate connection to the semiconductor die.

11. The lead frame assembly according to claim 1, wherein the die connection portion is a source connection to the semiconductor die.

12. The lead frame assembly according to claim 7, wherein the die connection portion is a source connection to the semiconductor die.

13. The lead frame assembly according to claim 1, further comprising a dam bar extending orthogonally across the one or more electrical leads.

14. A matrix of lead frames wherein a unit of the matrix comprises a lead frame assembly according to claim 1.

15. A matrix of lead frames wherein a unit of the matrix comprises a lead frame assembly according to claim 7.

16. The matrix of lead frames according to claim 14, wherein the unit of the matrix comprises a plurality of adjoining units, and the plurality of adjoining units of the matrix are connected by a respective plurality of dam bars of each of the lead frame assemblies.

* * * * *